(12) United States Patent
Johnston et al.

(10) Patent No.: US 7,241,706 B2
(45) Date of Patent: Jul. 10, 2007

(54) LOW K ILD LAYER WITH A HYDROPHILIC PORTION

(75) Inventors: Steven W. Johnston, Portland, OR (US); Nate Baxter, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 296 days.

(21) Appl. No.: 10/944,358

(22) Filed: Sep. 16, 2004

(65) Prior Publication Data
US 2006/0057838 A1     Mar. 16, 2006

(51) Int. Cl.
*H01L 21/31*     (2006.01)
*H01L 21/469*     (2006.01)

(52) U.S. Cl. .............. 438/784; 438/628; 438/783; 257/E29.111; 257/E21.489

(58) Field of Classification Search ............ 438/628, 438/784, 783, 789, 780; 257/E29.111, E21.487, 257/E21.159, E21.489
See application file for complete search history.

(56) References Cited

U.S. PATENT DOCUMENTS

| 6,383,913 | B1 * | 5/2002 | Tsai et al. ............... 438/624 |
| 2003/0054115 | A1 * | 3/2003 | Albano et al. ............ 427/487 |
| 2003/0089992 | A1 * | 5/2003 | Rathi et al. ............. 257/762 |
| 2005/0042388 | A1 * | 2/2005 | Mitsuoka et al. ........ 427/553 |

OTHER PUBLICATIONS

Ronald C. Hedden et al., "Comparison of Curing Processes for Porous Dielectrics Measurements from Specular X-Ray Reflectivity", Journal of the Electrochemical Society, 151 (8) F178-F181 (2004).

Carlo Waldfried et al., "Single Wafer Rapid Curing™ of Porous Low-k Materials", IEEE, pp. 226-228.

* cited by examiner

*Primary Examiner*—Caridad Everhart
(74) *Attorney, Agent, or Firm*—Kathy J. Ortiz

(57) ABSTRACT

Embodiments of the invention provide a relatively hydrophilic layer in a low k dielectric layer. The hydrophilic layer may be formed by exposing the dielectric layer to light having enough energy to break Si—C and C—C bonds but not enough to break Si—O bonds.

24 Claims, 6 Drawing Sheets

1

LOW K ILD LAYER WITH A HYDROPHILIC PORTION

BACKGROUND

Background of the Invention

In a microelectronic structure, such as a substrate, conductors, such as vias and traces, carry signals between layers of the substrate or other structure. The vias and traces by layers of dielectric materials. Low dielectric constant ("k value") materials are used in the layers of dielectric materials between the conductors to reduce resistance capacitance ("RC") delay and improve device performance.

A capping layer, such as an electrolessly-plated cobalt capping layer may be formed on the top of such conductors to help minimize issues such as electromigration. Such an electroless layer can be formed using a water-based solution that includes the cobalt or other material that may form the capping layer. However, some low-k materials used are hydrophobic, which may make formation of such an electroless layer difficult.

DETAILED DESCRIPTION

In various embodiments, an apparatus and method relating to the formation of a substrate are described. In the following description, various embodiments will be described. However, one skilled in the relevant art will recognize that the various embodiments may be practiced without one or more of the specific details, or with other methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Reference throughout this specification to "one embodiment" or "an embodiment" means that a particular feature, structure, material, or characteristic described in connection with the embodiment is included in at least one embodiment of the invention. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included or omitted from the described embodiment.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment and steps may be left out/or added in additional embodiments.

Figure 1A:
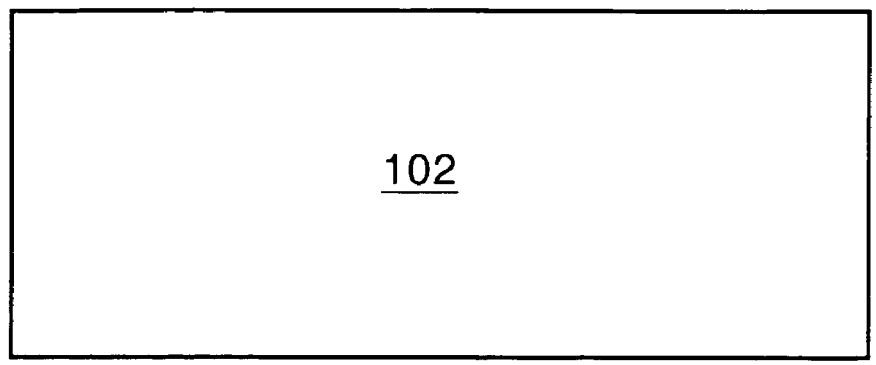
FIGS. 1a through 1e are cross sectional side views that illustrate how a hydrophilic portion of a low k dielectric layer may be formed.

FIG. 1a is a side cross sectional view of a substrate 102 on which a dielectric layer with a low dielectric constant ("k value"), conductive layers such as vias and/or traces, and a capping layer may be formed, according to one embodiment of the present invention. The substrate 102 may comprise a piece of material, such as a piece of silicon or other material. The substrate 102 may be any surface generated by processing, and may comprise, for example, active and passive devices that are formed on a silicon wafer, such as transistors, capacitors, resistors, local interconnects, and others. The substrate 102 may be a physical structure, a layer that is a basic workpiece transformed and/or added to by various processes into the desired microelectronic configuration, or another material or materials. The substrate 102 may include conducting material, insulating material, semiconducting material, and other materials or material combinations. In some embodiments, the substrate 102 may be a multi-layered structure.

For example, in one embodiment, the substrate 102 may be a partially complete microprocessor die, with multiple transistors. In such an embodiment, there may be one or more layers of traces and/or vias separated by interlayer dielectric ("ILD") layers formed or to be formed on the substrate 102, or as part of the substrate 102, to connect the devices of the microprocessor die with other components. In other embodiments, the substrate 102 may be another type of structure.

Figure 1B:
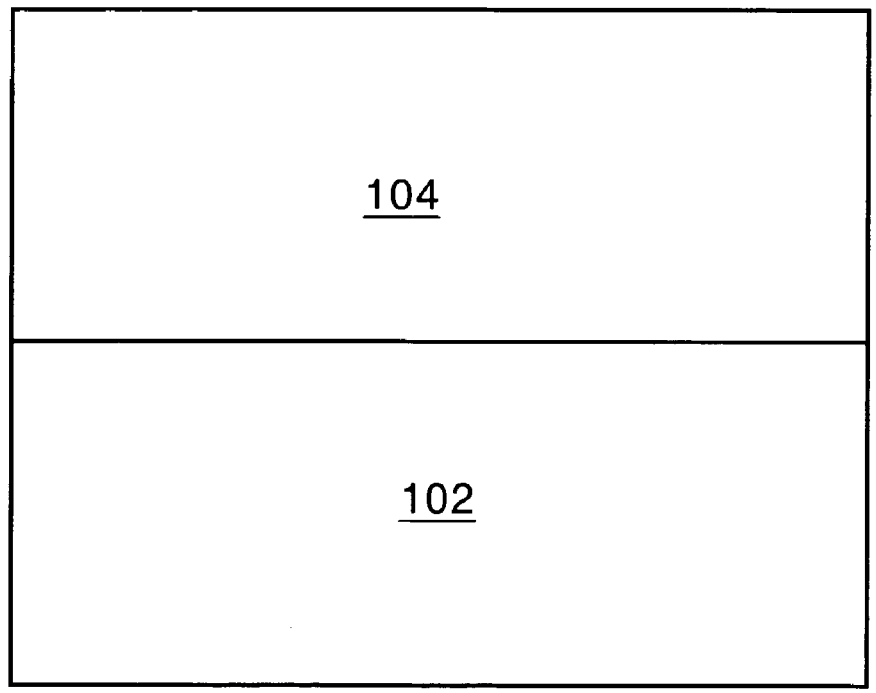

FIG. 1b is a side cross sectional view of the substrate 102 on which a dielectric layer 104 has been formed, according to one embodiment. In some embodiments, the dielectric layer 104 may be an ILD layer that will separate conductive interconnects that connect devices of a microprocessor die with other components, such as packaging substrates. In other embodiments, the dielectric layer 104 may serve a different purpose.

The dielectric layer 104 may be a low-k dielectric layer. In some embodiments, the k value of the dielectric layer 104 may be below 3.2. In another embodiment, the k value may be below 3.0. In another embodiment, the k value may be between about 3.0 and about 2.4. In yet other embodiments, the k value may be different.

The dielectric layer 104 may include one or more of carbon, silicon, and/or oxygen. The layer 104 may also include hydrogen. For example, the dielectric layer 104 may include 10% to 75% carbon, with oxygen and silicon. There may be Si—C bonds and/or C—C bonds. In an embodiment, the composition of the dielectric layer 104 may be relatively consistent throughout the layer 104, from the bottom (nearer to the substrate 102) to the top (further from the substrate 102). Thus, there may be about the same percentage or ratio of carbon/silicon/oxygen in a sample of material taken from the bottom of the dielectric layer 104 as would be in a sample taken from the top of the layer 104. Similarly, the ratios of Si—C and/or C—C bonds to Si—O bonds may be fairly consistent throughout the dielectric layer 104; the ratio of Si—C bonds to Si—O bonds at the bottom of the layer 104 may be similar to the ratio of Si—C bonds to Si—O bonds at the top of the layer 104.

The dielectric layer 104 may be relatively hydrophobic. Water and/or water-based solutions may have a tendency to form discrete beads on the surface of the dielectric layer 104 rather than spread out and evenly cover the surface. The presence of SiOC and/or SiCH$_3$ in the dielectric layer 104, which may help make the dielectric layer 104 low k, may also make the dielectric layer 104 hydrophobic.

In an embodiment, the dielectric layer 104 may have a thickness 114 of less than about 15 microns. In some embodiments, the dielectric layer 104 may have a thickness 114 of less than about 10 microns. In some embodiments, the dielectric layer 104 may have a thickness 114 of less than about 1 micron. In yet other embodiments, the dielectric layer 104 may have a thickness 114 that is greater or less.

Figure 1C:
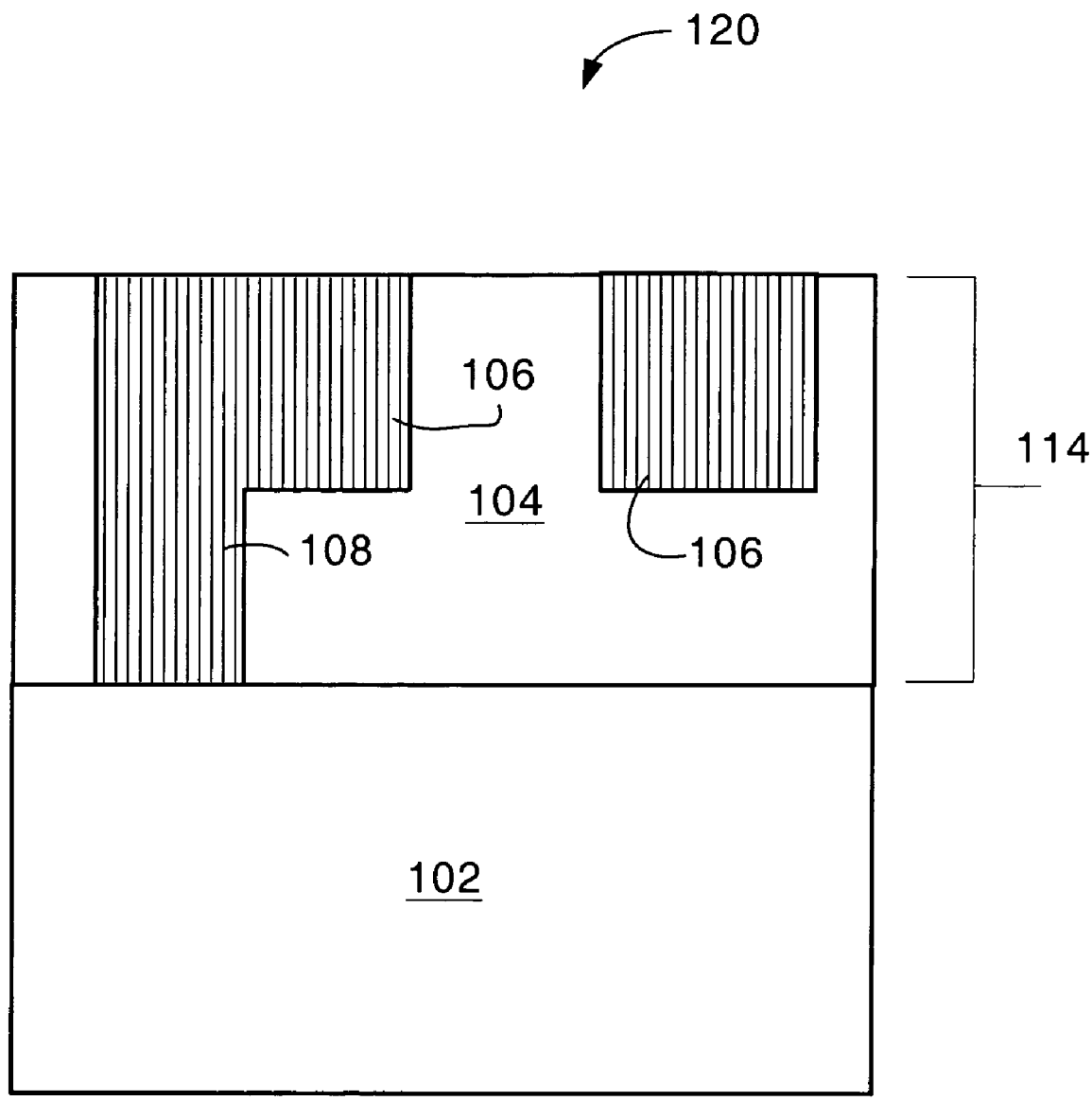

FIG. 1c is a side cross sectional view of the substrate 102, the dielectric layer 104, and conductive traces 106 and a via 108, which have been formed in the dielectric layer 104, according to one embodiment. While only two traces 106 and one via 108 are shown, in some embodiments, there may be many more traces 106 and vias 108. The traces 106 and via 108 may comprise any conductive material, including copper, aluminum, or other materials. The traces 106 and via 108 may be formed by any suitable method, such as by using a patterned photoresist layer to protect selected portions of the dielectric layer 104, etching trenches into unprotected portions of the dielectric layer 104, then depositing conductive material into the trenches. Prior to depositing the conductive material, a barrier layer, seed layer, and/or adhesion layer may be deposited in some embodiments. The top of the traces 106, vias 108, and dielectric layer 104 may then be planarized to make the top surface of the dielectric layer 104 substantially even with the top of the conductive material that forms the traces 106 and via 108. The top of the traces 106, vias 108, and dielectric layer 104 may be planarized by any suitable method, such as by a chemical mechanical polishing ("CMP") process.

The structure as shown in FIG. 1c may be referred to as a "homogeneous dielectric layer" device 120 or "pre-exposure" device 120 because at this point, the dielectric layer 104 may have a substantially consistent composition throughout, as described above, and the exposure process described below has not yet occurred.

Figure 1D:
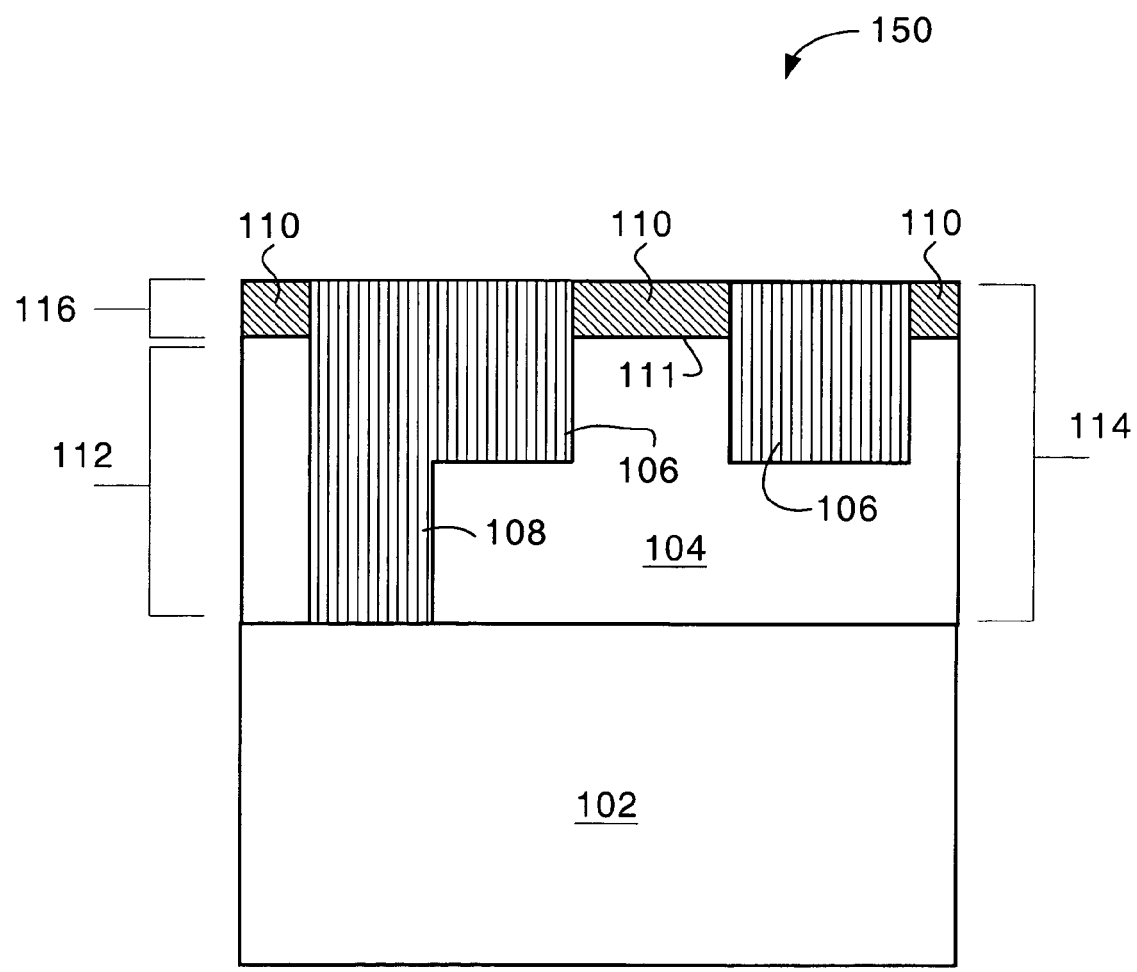

FIG. 1d is a side cross sectional view of the substrate 102, the dielectric layer 104, conductive traces 106 and via 108, after formation of a top portion 110 from a portion of the dielectric layer 104, according to one embodiment. The structure as shown in FIG. 1d may be referred to as a "heterogeneous dielectric layer" device 150 or "post-exposure" device 150 because at this point, the dielectric layer 104 may no longer have a substantially consistent composition throughout, and the exposure process described below may have been performed.

The dielectric layer 104 may include a top portion 110 (the top portion being the portion of the dielectric layer 104 furthest from the substrate 102) that may have a different composition than the rest of the dielectric layer 104. The top portion 110 may also be considered a top layer 110. In an embodiment, the top portion 110 may comprise a material that is hydrophilic compared to the rest of the dielectric layer 104. Thus, the top portion 110 may be referred to as a hydrophilic portion 110 or hydrophilic layer 110. The rest of the dielectric layer 104 may be referred to as a hydrophobic portion 112 or hydrophobic layer 112 (since it is hydrophobic relative to the top hydrophilic portion 110) or the bottom portion 112 or bottom layer 112 (since it is closer to the substrate 102).

In an embodiment, there may be less carbon in the hydrophilic portion 110 than in the hydrophobic portion 112, which may be caused by removal of carbon from the top of the dielectric layer 104 to form the hydrophilic portion 110. This may result in the homogeneous device 120 becoming a heterogeneous device 150. Since carbon may be removed, the composition of the dielectric layer 104 may no longer be relatively consistent. Thus, there may be a different percentage or ratio of carbon/silicon/oxygen in the hydrophilic portion 110 than in the hydrophobic portion 112, with less carbon being in the hydrophilic portion 110 in one embodiment. Similarly, the ratio of Si—C and/or C—C bonds to Si—O bonds may be smaller at the top portion 110 of the dielectric layer 104 than at the bottom portion 112 of the dielectric layer 104. The difference in the amount of carbon between the top 110 and bottom 112 may be chosen to make the top portion 110 hydrophilic enough, while retaining a low capacitance in the dielectric layer 104. In an embodiments, the amount of carbon at the top surface of the top portion 110 may be reduced by 5%, 10%, 25%, or another amount over the amount of carbon in the bottom portion 112.

Since there may be less carbon in the top portion 110 than the bottom portion 112, and there may be relatively less SiOC and SiCH$_3$ compared to SiO$_2$ in the top portion 110 than the bottom portion 112, the top portion 110 may be more hydrophilic and may have a higher k value than the bottom portion 112. In an embodiment, the bottom portion 112 of the dielectric layer 104 may have substantially the same composition as the entire dielectric layer 104 did in the homogeneous dielectric layer device 120. The elements, including carbon, silicon, and oxygen in an embodiment, of the bottom portion may be present in the bottom portion 112 in substantially the same ratios as in dielectric layer 104 of the pre-exposure device 120, and the elements may be present in the top portion 110 in a ratio that includes relatively less carbon than was in the dielectric layer 104 of the pre-exposure device 120.

In an embodiment, the top layer 110 may have a depth 116 or thickness 116 that is between about 1% to about 15% of the thickness 114 of the dielectric layer 104. In an embodiment, top portion 110 may have a thickness 116 of up to half the thickness 114 of the dielectric layer 104. In an embodiment the top layer 110 may have a thickness 116 that is between about 30 angstroms to about 500 angstroms. In some embodiments, the top layer 110 may have enough thickness 116 to provide a hydrophilic surface on which liquids may be deposited. In yet other embodiments, the top portion 110 may have different thicknesses that may be greater or less than those described above.

The hydrophilic portion 110 may be a graded portion. That is, while FIG. 1d shows the hydrophilic portion 110 as a single layer, the top portion may not be homogeneous through its thickness 116. There may be relatively less carbon at the top of the layer 110 than at the bottom of the layer 110 that is adjacent the hydrophobic portion 112 in an embodiment. In an embodiment, the top of the hydrophilic portion 110 (further from the substrate 102) may be more hydrophilic and/or have a higher k value than the bottom 111 of the hydrophilic portion 110 (closer to the substrate 102).

In an embodiment, there may be a carbon percentage difference, where carbon percentage difference may be defined as the difference between the percentage of the composition that is carbon of the homogeneous dielectric layer device 120 (and/or of the portion of the dielectric layer near the substrate 102, which may be the same percentage) and the percentage of the composition that is carbon at a given point where the difference is to be measured. In an embodiment where the hydrophilic portion 110 is a graded layer, the bottom 111 of the hydrophilic portion 110 may be defined as the position where the carbon percentage difference is less than 10% than the carbon percentage difference of the top of the top layer 110.

Figure 1E:
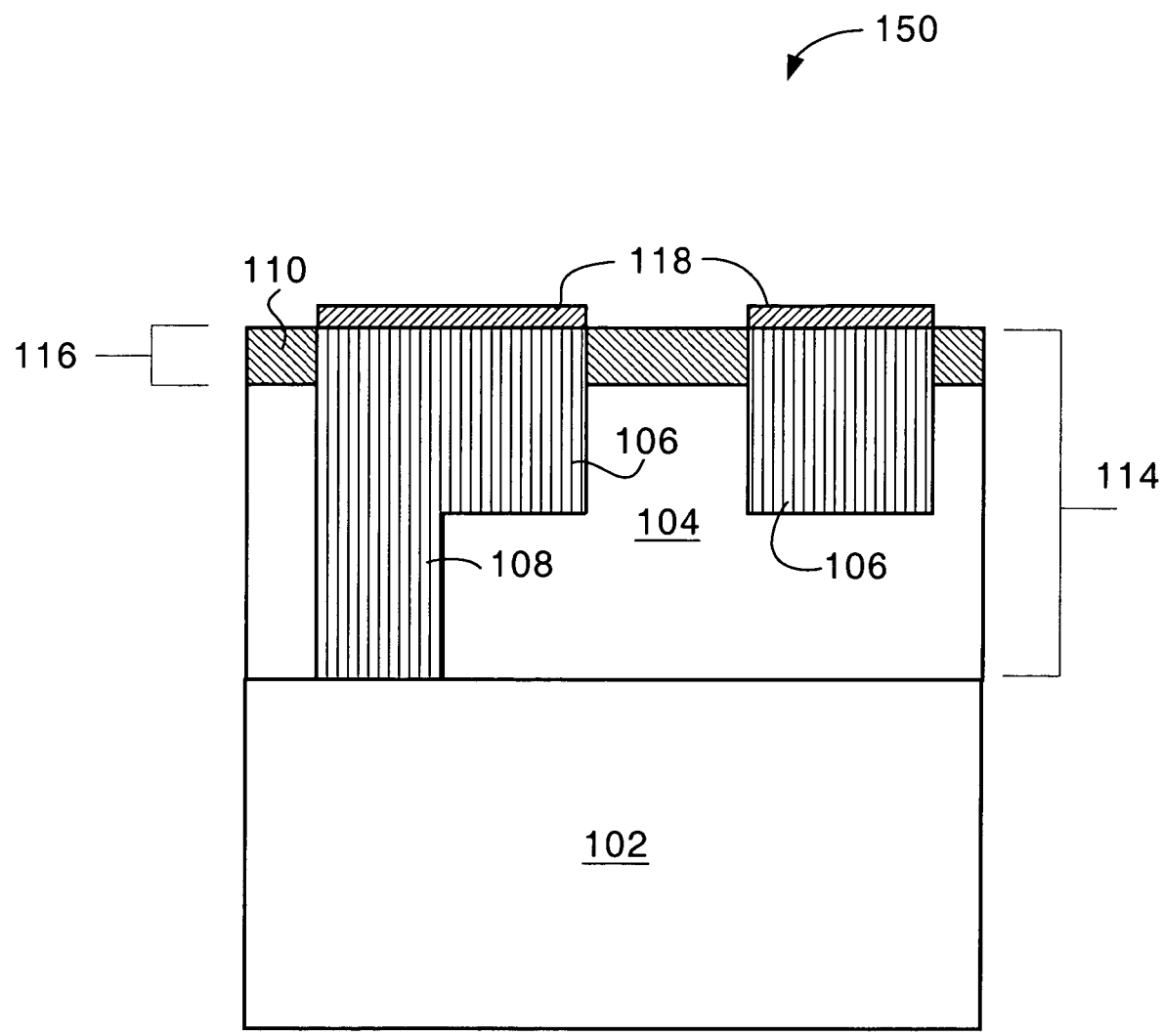

FIG. 1e is a side cross sectional view of the substrate 102, the dielectric layer 104, conductive traces 106 and via 108, and the top hydrophilic layer 110, after formation of a cap layer 118 on the traces 106, according to one embodiment. The cap layer 118 may be a thin conductive layer that may act as a barrier layer to prevent diffusion or electromigration of the material of the traces 106. In an embodiment, the cap layer 118 may comprise cobalt, although it may comprise other materials in other embodiments. The cap layer 118 may be an electroless cap layer 118, or may be formed by other suitable methods. In embodiments, where an electroless plating process is used to form the cap layer 118, the hydrophilic top layer 110 of the dielectric layer 104 may help the electroless solution contact the entire surface, rather than form beads which may result in an uneven or partially formed cap layer 118.

After formation of the cap layer 118, there may be further processing performed. For example, one or more additional dielectric layers, each with traces and vias may be formed on the dielectric layer 104 and traces 106. One or all of such additional dielectric layers may have a top hydrophilic portion formed out of part of the dielectric layer, and cap layers may be formed on the traces in the additional dielectric layers. There may be similar dielectric layers with hydrophilic portions and traces as part of the substrate 102 as well.

Figure 2:
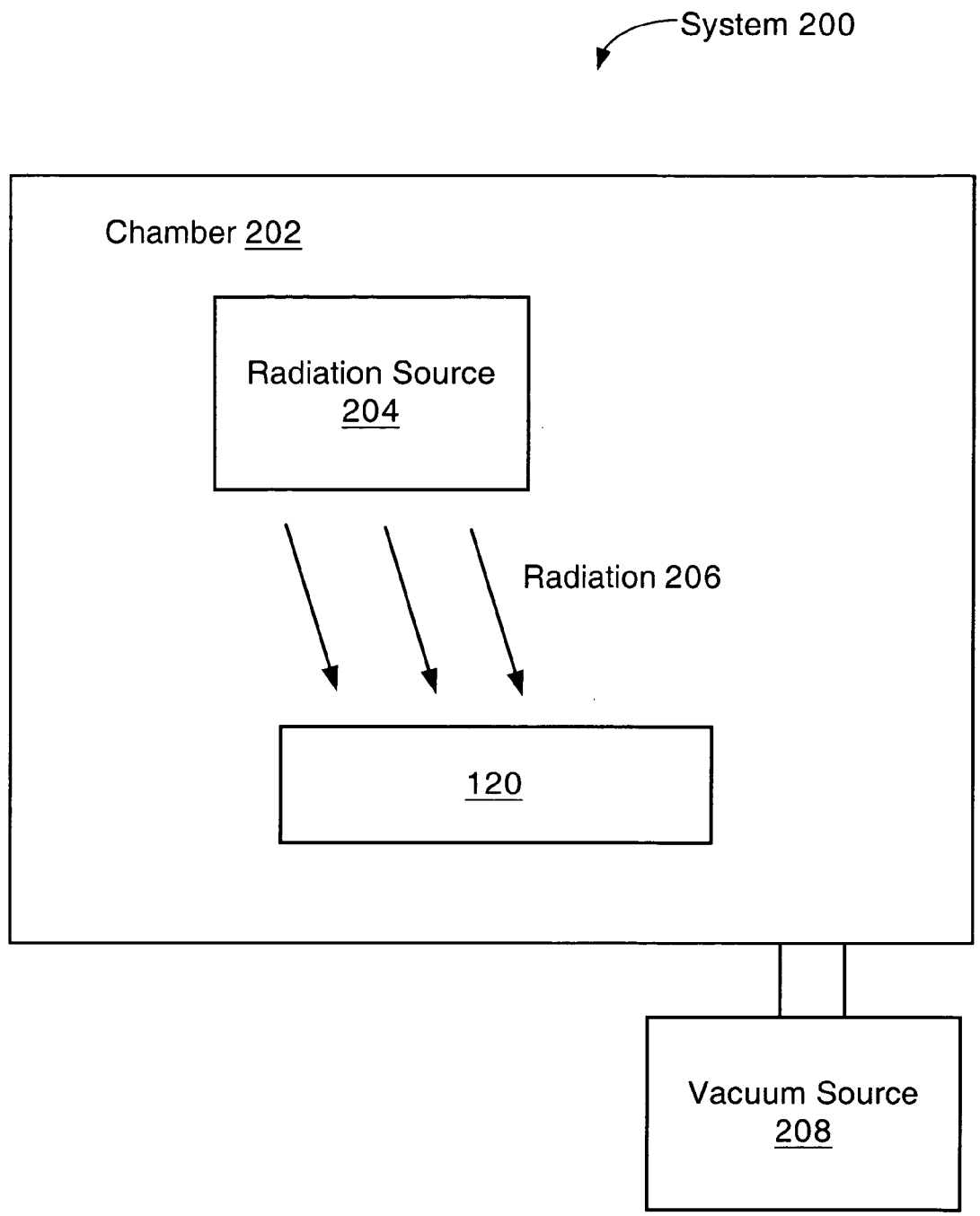
FIG. 2 illustrates a system that may be used to form a hydrophilic layer out of a portion of the dielectric layer.

FIG. 2 illustrates a system 200 that may be used to form the hydrophilic layer 110 out of a portion of the dielectric layer 104. In an embodiment, the system 200 may include a chamber 202 in which the pre-exposure device 120, with its substantially homogeneous dielectric layer 104 may be positioned. The system 200 may include a vacuum source 208, which may operate to form a partial vacuum within the chamber 202. The system 200 may also include a radiation source 204, which may produce and/or direct electromagnetic radiation 206 at the dielectric layer 104 of the pre-exposure device 120 to turn it into the post-exposure device 150.

In one embodiment, the radiation source 204 generates ultraviolet light 206 that is directed at the pre-exposure device 120. The dielectric layer 104 is thus exposed to the electromagnetic radiation 206. For example, ultraviolet radiation 206 with a wavelength of about 172 nanometers may be directed to the dielectric layer 104 in an embodiment. This radiation 206 may have an energy level of about 9.75 eV (about 699 kJ/mole at 298 K). Such radiation 206 may have enough energy to break Si—C bonds, which have a bond strength of about 451.5 kJ/mole, and C—C bonds, which have a bond strength of about 610 kJ/mole. Si—O bonds, with a bond strength of about 799.6 kJ/mole tend not to be broken by such radiation 206. This may result in the bonds between carbon and other elements at the top the dielectric layer 104 (the portion of the dielectric layer 104 that is struck by the radiation 206) being broken and the carbon leaving the dielectric layer 104 to the surrounding environment. This may result in less carbon and relatively more Si—O being present in the top portion 110 of the dielectric layer 104, which may result in the top portion 110 of the dielectric layer 104 becoming more hydrophilic than the bottom portion 112 of the dielectric layer 104.

Similarly, other bonds may be selectively broken at a top portion 110 of the dielectric layer 104 to form a relatively hydrophilic portion 110. Si—$CH_3$ bonds, with a bond strength of about 283 kJ/mole, and Si—H bonds, with a bond strength of about 299 kJ/mole, may be selectively broken, leaving Si—O bonds relatively unaffected. Since Si—$CH_3$ and Si—H are relatively hydrophobic and Si—O is relatively hydrophilic, such a situation would make the top portion 110 more hydrophilic.

Given known values of various bonds, a wavelength of radiation 206 and other process conditions may be chosen to selectively break bonds. Some additional bond strength values are as follows: C—O bonds, with a bond strength of about 1077 kJ/mole, C—N bonds, with a bond strength of about 754 kJ/mole, Si—OH bonds, with a bond strength of about 483 kJ/mole, Si—$CH_2$ bonds, with a bond strength of about 527 kJ/mole, Si—CH bonds, with a bond strength of about 543 kJ/mole, and Si—F bonds, with a bond strength of about 553 kJ/mole.

In another embodiment, the wavelength of the radiation 206 may be different than 172 nanometers. In an embodiment, the wavelength of the radiation 206 may be chosen to have enough energy to break Si—C and C—C bonds but not enough to break Si—O bonds. In some embodiments, the radiation 206 used may have a wavelength between about 160 nanometers and about 275 nanometers, although other wavelengths may also be used. In an embodiment, the pre-exposure device 120 may be exposed to radiation 206 for less than about 45 seconds, although different times may be used. Each of the wavelength and exposure time may affect the depth 116 of the top portion 110, and the amount of carbon removed from the top surface of the dielectric layer 104. For example, with a single wavelength, longer exposure may result in removal of more carbon and a greater depth 116, and shorter exposure may result in removal of less carbon and a shallower depth 116. Similarly, for a given exposure time, the depth 116 and amount of carbon removed may be controlled by selecting a wavelength.

In some embodiments, the pre-exposure device 120 may be exposed to radiation 206 at a temperature below about 400 degrees Celsius. The temperature at which the pre-exposure device 120 is exposed to radiation 206 may be chosen based on the type of material that comprises the dielectric layer 104. For example, an organic dielectric layer 104 may be exposed to radiation 206 at a lower temperature than a carbon doped oxide dielectric layer 104.

Figure 3:
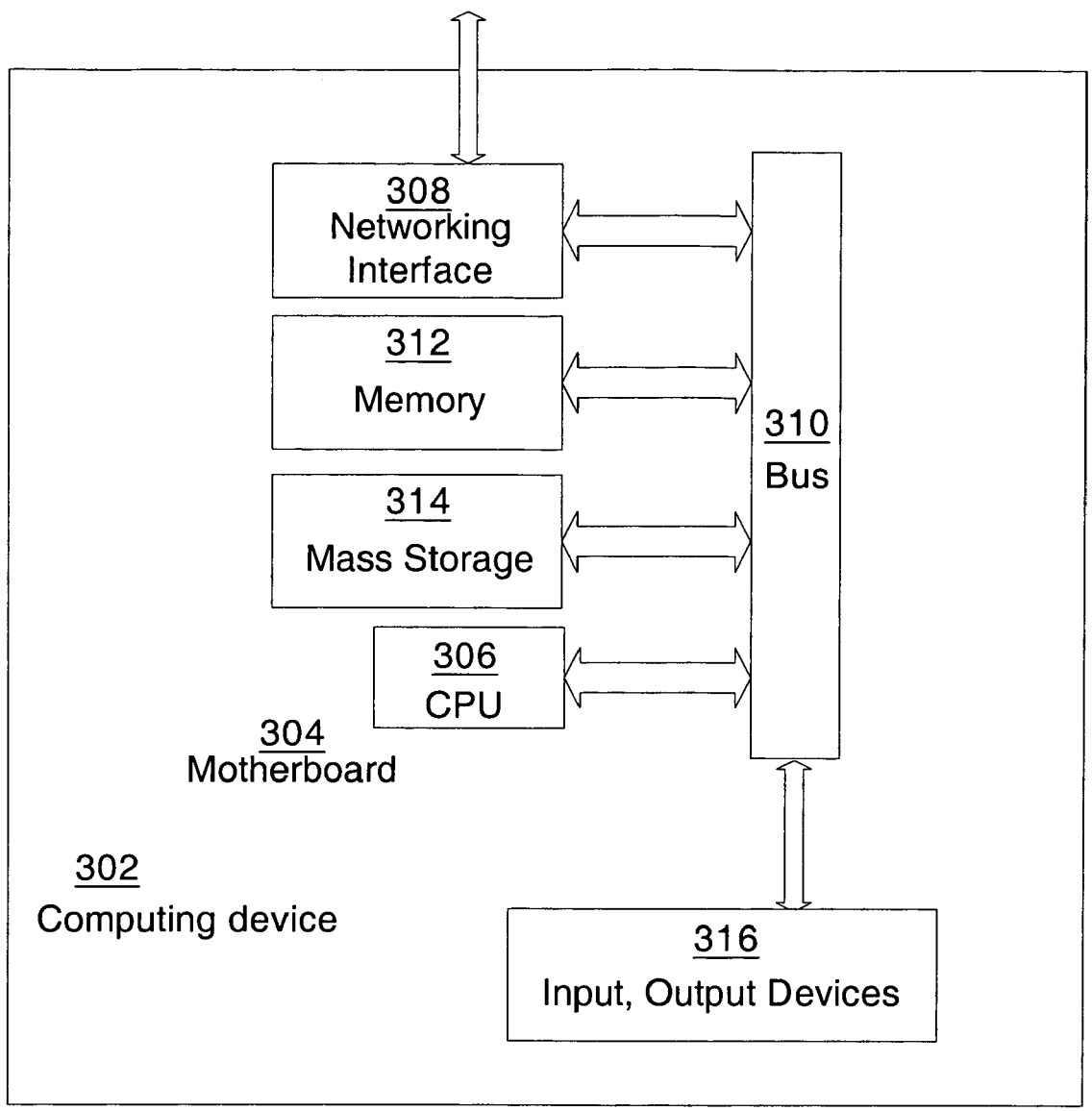
FIG. 3 illustrates a system in accordance with one embodiment.

FIG. 3 illustrates a system 300 in accordance with one embodiment. As illustrated, for the embodiment, system 300 includes computing device 302 for processing data. Computing device 302 may include a motherboard 304. Motherboard 304 may include in particular a processor 306, and a networking interface 308 coupled to a bus 310. More specifically, the substrate 102 and dielectric layer 104 with the hydrophilic portion 110 described above may comprise part of the processor 306. In an embodiment where the substrate 102, dielectric layer 104, and hydrophilic portion 110 comprise portions of a microprocessor die 306, the die 306 may be attached to a package substrate, which may then be attached to the motherboard 304.

Depending on the applications, system 300 may include other components, including but are not limited to volatile and non-volatile memory 312, a graphics processor, a digital signal processor, a crypto processor, a chipset, mass storage 314 (such as hard disk, compact disk (CD), digital versatile disk (DVD) and so forth), input and/or output devices 316, and so forth. One or more of these components may also include the earlier described dielectric layer 104 with the hydrophilic portion 110.

In various embodiments, system 300 may be a personal digital assistant (PDA), a mobile phone, a tablet computing device, a laptop computing device, a desktop computing device, a set-top box, an entertainment control unit, a digital camera, a digital video recorder, a CD player, a DVD player, or other digital device of the like.

The foregoing description of the embodiments of the invention has been presented for the purposes of illustration and description. It is not intended to be exhaustive or to limit the invention to the precise forms disclosed. This description and the claims following include terms, such as left, right, top, bottom, over, under, upper, lower, first, second, etc. that are used for descriptive purposes only and are not to be construed as limiting. The embodiments of a device or article described herein can be manufactured, used, or shipped in a number of positions and orientations. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

I claim:

1. A method, comprising:
depositing a first interlayer dielectric layer on a substrate, the first interlayer dielectric layer having a bottom surface closer to the substrate and a top surface further from the substrate;
exposing the first interlayer dielectric layer to electro-magnetic radiation to form a hydrophilic top layer at the top surface of the first interlayer dielectric layer, the hydrophilic top layer being more hydrophilic than a portion of the first interlayer dielectric layer below the hydrophilic top layer; and
wherein the first interlayer dielectric layer comprises carbon, silicon, and oxygen in a first ratio before the first interlayer dielectric layer is exposed to electro-magnetic radiation to form the hydrophilic top layer, the hydrophilic top layer comprises carbon, silicon, and oxygen in a second ratio that includes relatively less carbon than the first ratio, and the portion of the first interlayer dielectric layer below the hydrophilic top layer comprises carbon, silicon, and oxygen in a third ratio substantially the same as the first ratio.

2. The method of claim 1, wherein exposing the first interlayer dielectric layer to electro-magnetic radiation comprises exposing the first interlayer dielectric layer to radiation with a wavelength between about 160 nanometers and about 275 nanometers for less than about 45 seconds.

3. The method of claim 1, wherein the first interlayer dielectric layer has a thickness, the top layer extends from the top surface of the dielectric layer to a depth below the top surface, and wherein the depth is between about one percent and about fifteen percent of the thickness.

4. The method of claim 1, wherein the hydrophilic top layer is a graded layer with relatively less carbon at a top surface and more carbon further from the top.

5. The method of claim 1, wherein the first dielectric layer prior to exposure to electro-magnetic radiation has a dielectric constant value of less than about 3.

6. The method of claim 5, wherein the portion of the first interlayer dielectric layer below the hydrophilic top layer consists of substantially the same material as the first dielectric layer prior to exposure to electro-magnetic radiation, and has about the same dielectric constant value as the first dielectric layer prior to exposure to electro-magnetic radiation.

7. The method of claim 1, further comprising:
forming a plurality of transistors on the substrate, wherein the first interlayer dielectric layer is deposited on the plurality of transistors;
forming a conductive trace in the first interlayer dielectric layer;
planarizing the conductive trace and first interlayer dielectric layer; and
depositing a capping layer that comprises cobalt on the conductive trace.

8. The method of claim 7, wherein the plurality of transistors, first interlayer dielectric layer, conductive trace, and capping layer comprise a microprocessor die, the method further comprising attaching the die to a package substrate.

9. A method, comprising:
forming a dielectric layer on a substrate, the dielectric layer comprising carbon, silicon, and oxygen;
exposing the dielectric layer to electro-magnetic radiation to selectively break carbon-carbon bonds and silicon-carbon bonds, while substantially not breaking silicon-oxygen bonds to form a top portion of the dielectric layer with a relatively lower concentration of silicon-carbon bonds than a lower portion of the dielectric layer that is closer to the substrate than the top portion; and
wherein the top portion is a graded portion with relatively less carbon at a top surface and more carbon further from the top.

10. The method of claim 9, wherein exposing the dielectric layer to electro-magnetic radiation comprises exposing the dielectric layer to radiation with a wavelength between about 160 nanometers and about 275 nanometers for less than about 45 seconds.

11. The method of claim 9, wherein the dielectric layer prior to exposure to electro-magnetic radiation has a dielectric constant value of less than about 3, the lower portion of the dielectric layer has a dielectric constant value of less than about 3, and the top portion has a dielectric constant value higher than that of the lower portion of the dielectric layer.

12. The method of claim 9, wherein the dielectric layer has a thickness, the top portion extends from a top surface of the dielectric layer to a depth below the top surface, and wherein the depth is between about one percent and about fifteen percent of the thickness.

13. The method of claim 9, further comprising:
forming a conductive trace in the dielectric layer;
planarizing the conductive trace and dielectric layer; and
depositing a capping layer on the conductive trace, wherein the capping layer is formed by an electroless plating process.

14. The method of claim 13, further comprising:
forming a plurality of transistors on the substrate, wherein the dielectric layer is an interlayer dielectric layer deposited on the plurality of transistors; and
wherein the plurality of transistors, dielectric layer, conductive trace, and capping layer comprise a microprocessor die.

15. A device, comprising:
a first interlayer dielectric layer with a top surface, the first interlayer dielectric layer comprising:
a hydrophilic top portion; and
a hydrophobic portion below the hydrophilic top portion, the hydrophobic portion being less hydrophilic than the hydrophilic top portion;
a first conductive trace extending at least partially into the first interlayer dielectric layer; and
a conductive capping layer on the first conductive trace.

16. The device of claim 15, wherein the first interlayer dielectric layer comprises silicon, carbon, and oxygen, and the hydrophilic top portion has a smaller carbon concentration than the hydrophobic portion.

17. The device of claim 15, wherein the dielectric constant value of the hydrophobic portion is less than or equal to about 3, and the dielectric constant value of the hydrophilic top portion is greater than the hydrophobic portion.

18. The device of claim 15, wherein the conductive capping layer comprises cobalt.

19. The device of claim 15, wherein the hydrophilic top layer is a graded layer with relatively less carbon at a top surface and more carbon further from the top.

20. The device of claim 15, wherein the first interlayer dielectric layer has a thickness and the hydrophilic top portion extends from the top surface of the first interlayer dielectric layer to a depth below the top surface.

21. The device of claim 20, wherein the depth is between about one percent and about fifteen percent of the thickness.

22. The device of claim 15, further comprising:
a plurality of transistors, wherein the first interlayer dielectric layer, the first conductive trace, the capping layer, and the plurality of transistors all comprise parts of a microprocessor die; and
a package substrate connected to the microprocessor die.

23. The device of claim 22, further comprising:
a motherboard connected to the package substrate;
a memory module connected to the motherboard;
a mass storage device connected to the motherboard;
at least one input device connected to the motherboard; and
at least one output device connected to the motherboard.

24. A device, comprising:
a first interlayer dielectric layer with a top surface, the first interlayer dielectric layer comprising:
a hydrophilic top portion; and
a hydrophobic portion below the hydrophilic top portion, the hydrophobic portion being less hydrophilic than the hydrophilic top portion;
a first conductive trace extending at least partially into the first interlayer dielectric layer; and
a capping layer on the first conductive trace;
wherein the first interlayer dielectric layer comprises silicon, carbon, and oxygen, and the hydrophilic top portion has a smaller carbon concentration than the hydrophobic portion; and
wherein the hydrophilic top portion is a graded layer with relatively less carbon at a top surface and more carbon further from the top.

* * * * *